(12) United States Patent
Happoya et al.

(10) Patent No.: US 8,241,937 B2
(45) Date of Patent: Aug. 14, 2012

(54) OPTICAL SEMICONDUCTOR DEVICE AND METHOD OF MANUFACTURING OPTICAL SEMICONDUCTOR DEVICE

(75) Inventors: Akihiko Happoya, Kamakura (JP);
Kazuhito Higuchi, Yokohama (JP);
Tomohiro Iguchi, Kawasaki (JP);
Kazuo Shimokawa, Yokohama (JP);
Takashi Koyanagawa, Yokohama (JP);
Michinobu Inoue, Yokohama (JP);
Izuru Komatsu, Yokohama (JP);
Hisashi Ito, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/221,634

(22) Filed: Aug. 30, 2011

(65) Prior Publication Data
US 2011/0312110 A1    Dec. 22, 2011

Related U.S. Application Data

(62) Division of application No. 12/552,504, filed on Sep. 2, 2009, now Pat. No. 8,039,857.

(30) Foreign Application Priority Data

Dec. 8, 2008   (JP) ................................. 2008-312149

(51) Int. Cl.
*H01L 21/00*   (2006.01)
(52) U.S. Cl. ............... 438/33; 438/22; 438/26; 438/28; 438/29; 438/39; 257/76; 257/79; 257/88; 257/91; 257/95; 257/E21.304
(58) Field of Classification Search .............. None
See application file for complete search history.

(56) References Cited

U.S. PATENT DOCUMENTS

| | | | |
|---|---|---|---|
| 6,531,328 B1 * | 3/2003 | Chen | 438/26 |
| 7,268,014 B2 | 9/2007 | Lee et al. | |
| 2004/0026703 A1 | 2/2004 | Adomi et al. | |

FOREIGN PATENT DOCUMENTS

| | | |
|---|---|---|
| JP | 51-60485 | 5/1976 |
| JP | 61-106059 | 7/1986 |
| JP | 7-122787 | 5/1995 |
| JP | 8-195508 | 7/1996 |

(Continued)

OTHER PUBLICATIONS

Office Action issued Feb. 22, 2011 in Japanese Application No. 2008-312149 filed Dec. 8, 2008 (w/English translation).

(Continued)

*Primary Examiner* — Kyoung Lee
(74) *Attorney, Agent, or Firm* — Oblon, Spivak, McClelland, Maier & Neustadt, L.L.P.

(57) ABSTRACT

An optical semiconductor device includes a light emitting element having a first surface and a second surface, the first surface having a first electrode provided thereon, the second surface being located on the opposite side from the first surface and having a second electrode provided thereon; a first conductive member connected to the first surface; a second conductive member connected to the second surface; a first external electrode connected to the first conductive member; a second external electrode connected to the second conductive member; and an enclosure sealing the light emitting element, the first conductive member, and the second conductive member between the first external electrode and the second external electrode, and being configured to transmit light emitted from the light emitting element.

2 Claims, 10 Drawing Sheets

FOREIGN PATENT DOCUMENTS

| | | |
|---|---|---|
| JP | 11-177138 | 7/1999 |
| JP | 11-251643 | 9/1999 |
| JP | 2002-261325 | 9/2002 |
| JP | 2004-186173 | 7/2004 |
| JP | 2006-310753 | 11/2006 |
| JP | 2007-329155 | 12/2007 |

OTHER PUBLICATIONS

Japanese Office Action issued Dec. 13, 2011, in Patent Application No. 2008-312149 (with English-language translation).

\* cited by examiner

OPTICAL SEMICONDUCTOR DEVICE AND METHOD OF MANUFACTURING OPTICAL SEMICONDUCTOR DEVICE

CROSS REFERENCE TO RELATED APPLICATIONS

This application is a division of and claims the benefit of priority under 35 U.S.C. §120 from U.S. Ser. No. 12/552,504 filed Sep. 2, 2009, and claims the benefit of priority under 35 U.S.C. §119 from Japanese Patent Application 2008-312149 filed Dec. 8, 2008, the entire contents of each of which is incorporated by reference herein.

BACKGROUND OF THE INVENTION

1. Field of the Invention

The present invention relates to an optical semiconductor device having a light emitting element incorporated therein and a method of manufacturing the optical semiconductor device.

2. Description of the Related Art

An optical semiconductor device using a light emitting diode (LED) as a light emitting element is one of examples of conventional optical semiconductor devices. This light emitting diode employs a shape as shown in FIG. 19, for example. Specifically, an optical semiconductor device 100 as a whole has a bullet shape, having a curved surface through which light is emitted from a light emitting diode serving as a light emitting element. A first lead frame 101 has a basin-shaped concave section 102 formed therein and a LED chip 103 is die-mounted on a bottom part of the concave section 102. Electrodes of the LED chip 103 are electrically connected to the first lead frame 101 via a metal wire 104 by wire bonding. Moreover, the LED chip 103 is also electrically connected to a second lead frame 105 via another metal wire 104.

The inside of the concave section 102 is sealed with a transparent resin 106 that contains phosphor. Therefore, the LED chip 103 is also covered with the resin 106. Meanwhile, a side surface of the concave section 102 functions as a reflection plate or a so-called reflector. When the LED chip 103 emits light, the light is emitted in a direction of an arrow indicated in FIG. 19.

The first lead frame 101 having the LED chip 103 mounted on the concave section 102, and the second lead frame 105 connected to the LED chip 103 via the metal wire 104, are sealed by a sealing resin. The first lead frame 101 and the second lead frame 105 partially protrude from one end of an enclosure 107 in which all the foregoing components are sealed. Moreover, as described above, another end of the enclosure 107 is formed into the curved surface and functions as a lens for outputting the light emitted from the LED chip 103.

Another type of a conventional optical semiconductor device is a light emitting diode package as disclosed in Japanese Patent Application Publication No. 2006-310753, for example. This light emitting diode package has a LED element die-mounted on a package substrate and the LED element and the package substrate are connected through a bonding wire so as to be connected electrically to each other.

BRIEF SUMMARY OF THE INVENTION

However, the above-described light emitting diode package having the configuration as disclosed in Japanese Patent Application Publication No. 2006-310753 and the optical semiconductor device of the bullet shape as shown in FIG. 19 have the following problems.

Specifically, a manufacturing process of each of these devices roughly includes a step of manufacturing the LED chip (the light emitting element) and a step of packaging the manufactured LED chip (the light emitting element). With the necessity to include these two steps having no relation with each other at all, however, the manufacturing of such an optical semiconductor device tends to have a larger number of processing steps. This results in an increase in the manufacturing costs and reduction in productivity.

Meanwhile, some light emitting diode packages employ a resin made of a mixture of phosphor and a ceramic or epoxy resin, for example, as a reflection plate (a reflector) for reflecting light emitted from a light emitting element. Nevertheless, employing such a reflector may cause an increase in the number of components constituting an optical semiconductor device and deterioration of the reflector due to the light emitted from the light emitting element.

The present invention has been made to address the above-described problems. An object of the present invention is to provide an optical semiconductor device and a method of manufacturing an optical semiconductor device, which are capable of reducing the number of components and the number of manufacturing steps to reduce manufacturing costs and of improving productivity as well.

A first aspect of an embodiment of the present invention provides an optical semiconductor device which includes a light emitting element having a first surface and a second surface, the first surface having a first electrode provided thereon, the second surface being located on the opposite side from the first surface and having a second electrode provided thereon; a first conductive member connected to the first surface of the light emitting element; a second conductive member connected to the second surface of the light emitting element; a first external electrode connected to the first conductive member; a second external electrode connected to the second conductive member; and an enclosure sealing the light emitting element, the first conductive member, and the second conductive member between the first external electrode and the second external electrode, and being configured to transmit light emitted from the light emitting element.

A second aspect of an embodiment of the present invention provides a method of manufacturing an optical semiconductor device which includes the steps of dividing a light emitting element wafer on a support body into light emitting elements by cutting the light emitting element wafer in a direction toward the support body; rearranging the light emitting elements by expanding the support body; forming a first conductive member on a first electrode provided on a first surface of each of the light emitting elements; sealing the light emitting elements and the first conductive members by an enclosure; detaching the support body and forming a second conductive member on a second electrode provided on a second surface of each of the light emitting elements; sealing the second electrodes and the second conductive members by the enclosure; connecting a first external electrode to the first conductive member and connecting a second external electrode to the second conductive member; performing dicing between each adjacent two of the light emitting elements to divide optical semiconductor devices from each other; and forming plating films respectively on the first external electrode and the second external electrode by plating.

A third aspect according to an embodiment of the present invention provides a method of manufacturing an optical semiconductor device which includes the steps of dividing a light emitting element wafer on a support body into light emitting elements by cutting the light emitting element wafer in a direction toward the support body; rearranging the light emitting elements by expanding the support body; forming a first conductive member on a first electrode provided on a first surface of each of the light emitting elements; sealing the light emitting elements and the first conductive members by an enclosure; detaching the support body and forming a second conductive member on a second electrode provided on a second surface of each of the light emitting elements; sealing the second electrodes and the second conductive members by the enclosure; grinding the first conductive member and the enclosure sealing the first conductive member so that the first conductive member and the enclosure are oblique with respect to the first surface; forming on the ground surface a first external electrode to be connected to the first conductive member; grinding the second conductive member and the enclosure sealing the second conductive member so that the second conductive member and the enclosure are oblique with respect to the second surface; forming on the ground surface a second external electrode to be connected to the second conductive member; performing dicing between each adjacent two of the light emitting elements to divide optical semiconductor devices from each other; and forming plating films respectively on the first external electrode and the second external electrode by plating.

BRIEF DESCRIPTION OF THE SEVERAL DRAWINGS

DETAILED DESCRIPTION OF THE INVENTION

Now, embodiments of the present invention will be described below in detail with reference to the accompanying drawings.

First Embodiment

Figure 1:
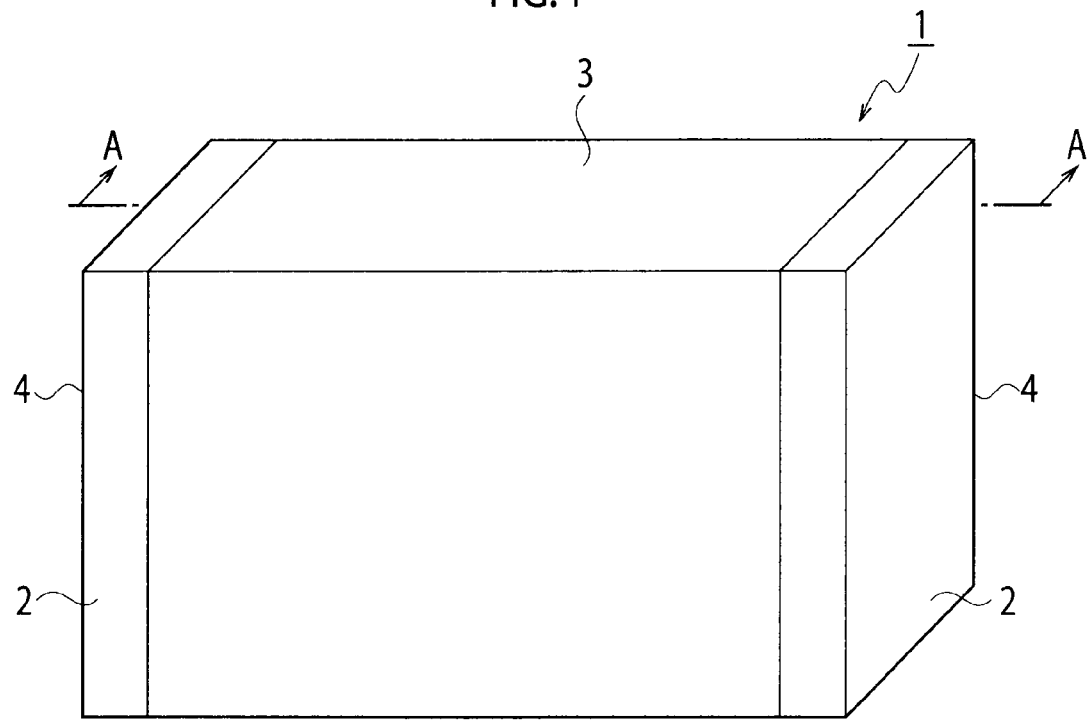
FIG. 1 is a perspective view showing an entire optical semiconductor device according to a first embodiment of the present invention.

An entire optical semiconductor device 1 according to a first embodiment of the present invention has a substantially rectangular solid shape as shown in FIG. 1. The optical semiconductor device 1 is provided with a pair of external electrodes 2, 2. The optical semiconductor device 1 is also provided with a region sealed by an enclosure 3, the region interposed between the pair of external electrodes 2, 2. This enclosure 3 seals a light emitting element (not shown in FIG. 1) which is provided inside the optical semiconductor device 1. Each of the paired external electrodes 2, 2 is plated. Five surfaces of each external electrode 2 except a surface contacting the enclosure 3 are covered with a plating film 4 to constitute five-surface electrodes.

The optical semiconductor device 1 is placed on a wiring pad provided on a substrate, which is not shown from a view angle illustrated in FIG. 1, for example, in a way that the external electrodes 2, 2 come into contact with the wiring pads. Then, an adhesive such as solder is disposed to cover the wiring pad and the external electrodes 2, 2 so that the substrate and the optical semiconductor device 1 are electrically connected to each other.

Figure 2:
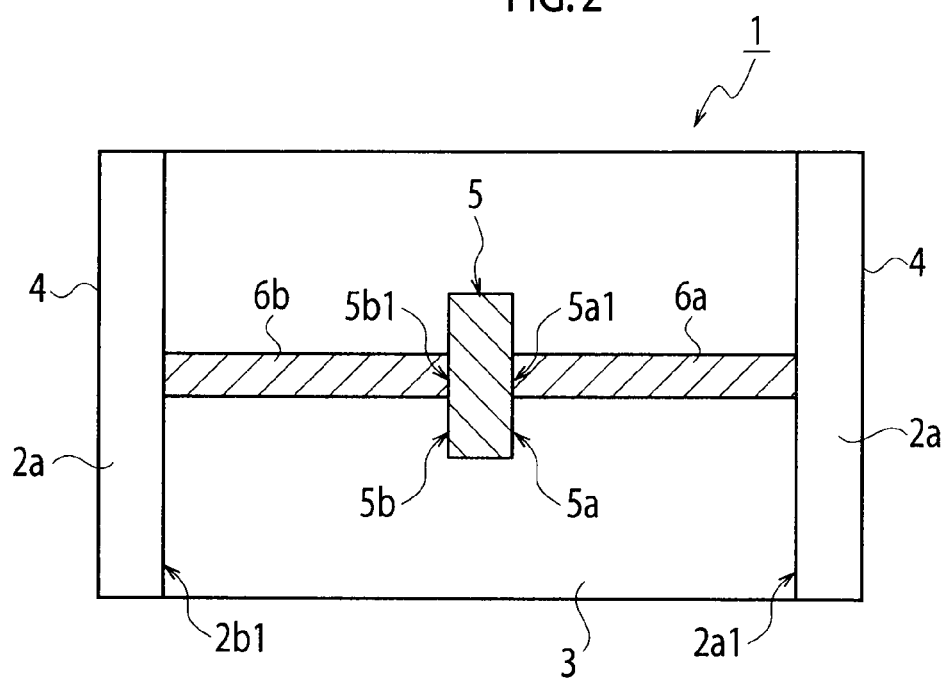
FIG. 2 is a cross-sectional view of the optical semiconductor device shown in FIG. 1 which is taken along the line A-A.

FIG. 2 is a cross-sectional view of the optical semiconductor device 1 shown in FIG. 1 which is taken along the line A-A. A light emitting element 5 is located substantially in the center in a longitudinal direction of the optical semiconductor device 1 and is sandwiched by the pair of external electrodes 2, 2 with the conductive members 6 interposed in between respectively. Moreover, the enclosure 3 is also sandwiched by the pair of external electrodes 2, 2 and seals therein the light emitting element 5 and conductive members 6. The plating film 4 is formed on the five surfaces of each external electrode 2.

The light emitting element 5 has a substantially rectangular solid shape and favorably a LED (light emitting diode) chip is employed therefore. The element is in a cube measuring about 200 μm to 300 μm per side, for example. A first electrode 5a1 of the light emitting element 5 is provided on a first surface 5a of the light emitting element 5. A second electrode 5*b*1 of the light emitting element 5 is provided on a second surface 5*b* on the opposite side from the first surface 5*a*. Although the light emitting element 5 includes a p-type electrode and an n-type electrode, the first electrode 5*a*1 and the second electrode 5*b*1 may be the p-type and the n-type, respectively, or vice versa.

A first conductive member 6*a* is connected to the first surface 5*a* of the light emitting element 5 and a second conductive member 6*b* is connected to the second surface 5*b* thereof. Moreover, the first external electrode 2*a* is connected to the first conductive member 6*a* and the second external electrode 2*b* is connected to the second conductive member 6*b* so as to sandwich the first conductive member 6*a* and the second conductive member 6*b*. By providing the light emitting element 5 inside the optical semiconductor device 1 as described above and applying a voltage from each external electrode 2 to the first electrode 5*a*1 or the second electrode 5*b*1 through the corresponding one of the conductive members 6, a current flows between the first electrode 5*a*1 and the second electrode 5*b*1 and the light emitting element 5 emits light.

Meanwhile, surfaces areas of the first surface 5*a* and the second surface 5*b* each provided with the electrode of the light emitting element 5 and surface areas of the first conductive member 6*a* and the second conductive member 6*b* are formed smaller than surface areas of the first external electrode 2*a* and the second external electrode 2*b* to be connected via the conductive members 6. The light emitting element 5 and the conductive members 6 designed to have such dimensions as described above can be located in the center inside the optical semiconductor device 1 and can be surrounded and sealed by the enclosure 3.

It is ideal that the light emitting element 5 is surrounded by nothing when the light emitting element 5 emits light. However, since the voltage is applied to the light emitting element 5 through the conductive members 6, the light emitting element 5 needs to be connected to the conductive members 6 to emit light. Each of the conductive members 6 only needs to be large enough to apply voltage required to cause the light emitting element 5 to emit light. The size (thickness) of the conductive members 6 is determined in consideration of all factors including the voltage required by the light emitting element 5, the material of the conductive members 6, and the like.

Next, a method of manufacturing the optical semiconductor device 1 according to the first embodiment of the present invention will be described with reference to FIG. 3 to FIG. 12.

Figure 3:
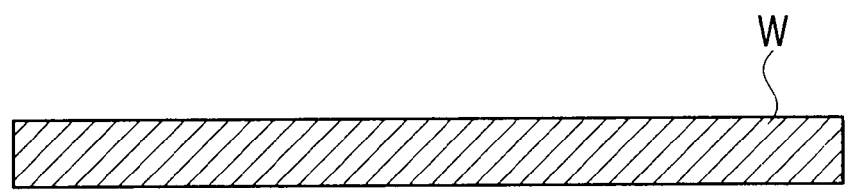
FIG. 3 is a first process drawing for explaining a method of manufacturing the semiconductor device according to the first embodiment of the present invention.

First, FIG. 3 shows a LED wafer (a light emitting element wafer) W. Though not illustrated in FIG. 3, the p-type electrode or the n-type electrode (the first electrode 5*a*1 or the second electrode 5*b*1) is formed on both surfaces of the wafer W. Meanwhile, in the embodiment of the present invention, the LED wafer W provided with the electrodes formed on both surfaces thereof is employed. However, the wafer W may be formed of, for example, a LED formed by depositing crystals by using a sapphire substrate or a LED formed by use of SiC (silicon carbide).

Figure 4:
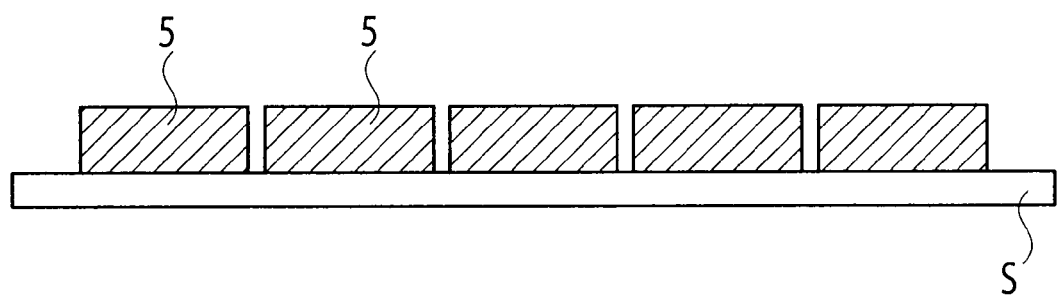
FIG. 4 is a second process drawing for explaining the method of manufacturing the semiconductor device according to the first embodiment of the present invention.

The wafer W is placed on a support body S and is divided into pieces (see FIG. 4). To divide the wafer W into pieces, the wafer W is diced, for example, from one surface to the other surface of the wafer W placed on the support body S. The method of dividing the wafer W into pieces is not limited only to this method and a method of forming a crack in a cutting position with a laser to divide the wafer into pieces may be employed, for example. After dividing the wafer W into pieces, multiple light emitting elements 5 thus divided into pieces are formed on the support body S as shown in FIG. 4.

Figure 5:
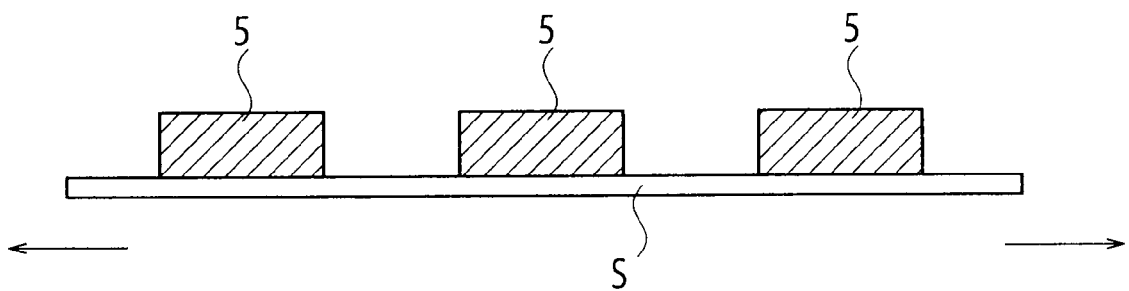
FIG. 5 is a third process drawing for explaining the method of manufacturing the semiconductor device according to the first embodiment of the present invention.

Next, the light emitting elements 5 on the support body S are rearranged from the original positions at the time of dividing into pieces in order to manufacture the optical semiconductor device 1. This rearrangement is performed by expanding (stretching) the support body S in a direction along arrows to spread distances between the adjacent light emitting elements 5 as shown in FIG. 5, for example. Here, as the material of the support body S to be expanded, favorably used is polyvinyl chloride, olefin resin or PET, for example.

The light emitting elements 5 are rearranged here by stretching the support body S which is also used at the time of dividing the wafer W into pieces as shown in FIG. 4. However, when a dicing sheet is used for dividing the wafer W into pieces, for example, the rearrangement may be performed by placing one surface of each divided light emitting element 5 onto another sheet suitable for rearrangement, such as the above-described support body S.

Further, the LED wafer generally is smaller in size than a semiconductor chip wafer. Therefore, the number of the light emitting elements 5 to be obtained by dividing the LED wafer into pieces is often fewer than the number of semiconductor chips to be obtained. Accordingly, when rearranging the divided light emitting elements 5, it is also possible to place the light emitting elements 5 obtained from multiple LED wafers onto a single support body. This placement makes it possible to manufacture the optical semiconductor devices 1 collectively and thereby to improve productivity thereof.

Then, the conductive members 6 are connected to the electrodes of each of the rearranged light emitting elements 5. First, a description will be given of a method of connecting the first conductive member 6*a* onto the first electrode 5*a*1 provided on the first surface 5*a* of the light emitting element 5. Here, the surface of the light emitting element 5 contacting the support body S represents the second surface 5*b* in FIGS. 6 to 9.

Figure 6:
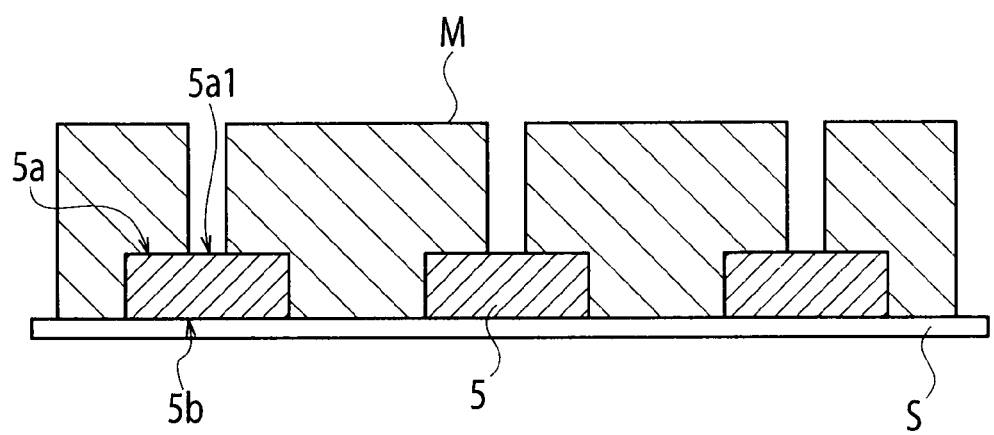
FIG. 6 is a fourth process drawing for explaining the method of manufacturing the semiconductor device according to the first embodiment of the present invention.
Figure 7:
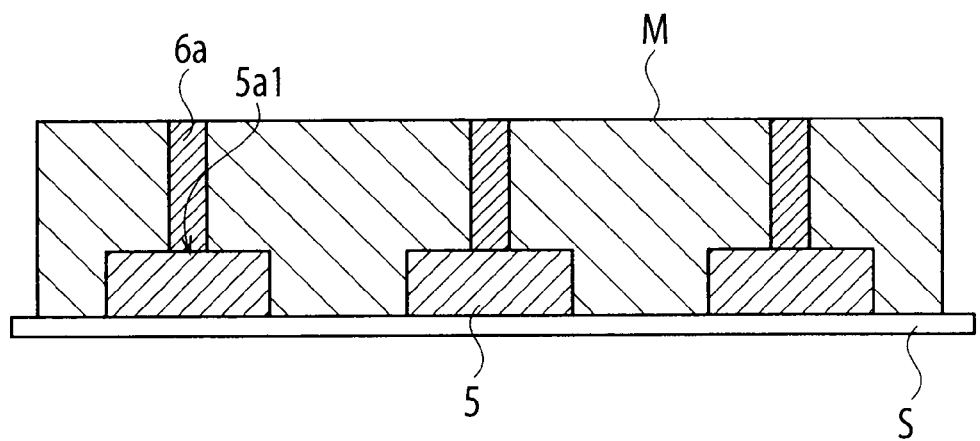
FIG. 7 is a fifth process drawing for explaining the method of manufacturing the semiconductor device according to the first embodiment of the present invention.

As shown in FIG. 6, a mask M is provided except regions on which the first conductive members 6*a* are formed in order to connect the first conductive members 6*a* to the first electrodes 5*a*1. The mask M is also provided on the first surfaces 5*a* and spaces between the each adjacent two light emitting elements 5 except the regions on the first electrodes 5*a*1 on which the conductive members 6*a* are formed. In this state, the first conductive members 6*a* are formed by use of an electrolytic plating method, for example (see FIG. 7). Copper (Cu) is favorably used for the conductive member 6, for example.

Figure 8:
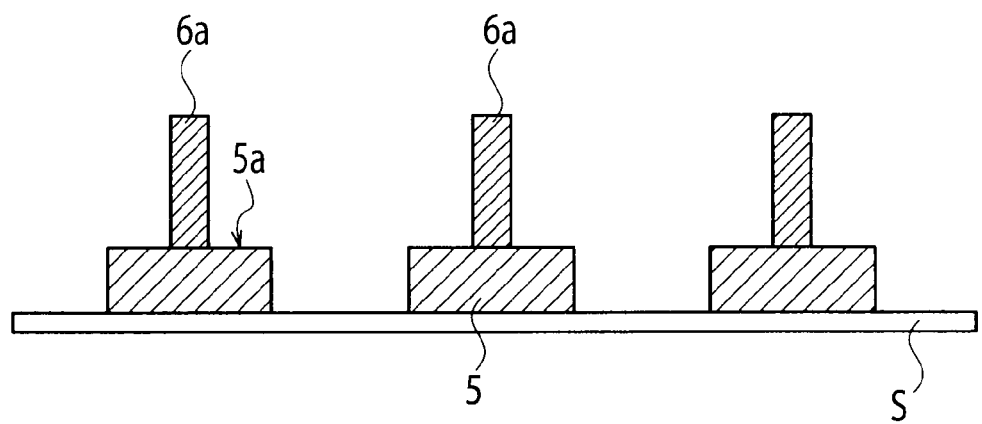
FIG. 8 is a sixth process drawing for explaining the method of manufacturing the semiconductor device according to the first embodiment of the present invention.

FIG. 8 shows a state where the mask M is removed and the first conductive members 6*a* are connected to the first electrodes 5*a*1. As described previously, in order not to prevent the light emitting element 5, when emitting light, from emitting light, each of the first conductive members 6*a* is designed to have a small area so as to occupy only a small area of the first surface 5*a* of the light emitting element 5.

Figure 9:
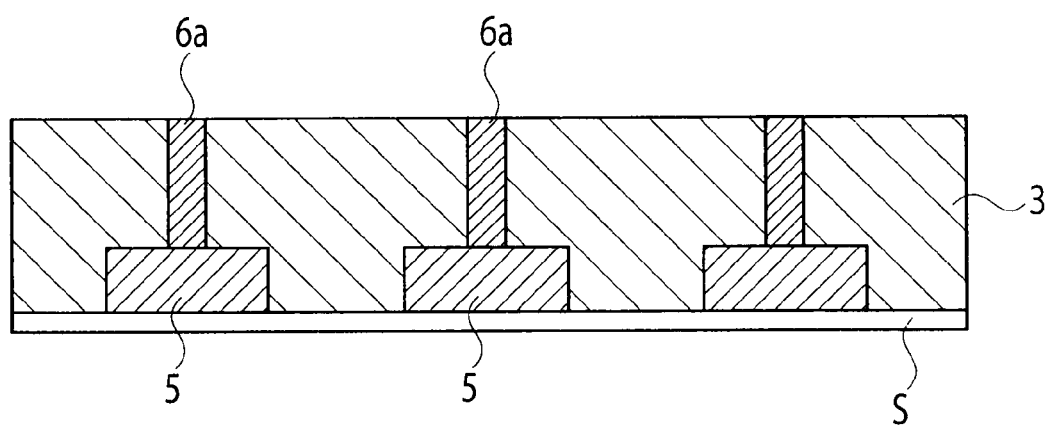
FIG. 9 is a seventh process drawing for explaining the method of manufacturing the semiconductor device according to the first embodiment of the present invention.

In this state, the light emitting elements 5 and the first conductive members 6*a* are sealed by using the enclosure 3 as shown in FIG. 9. The enclosure 3 is made of resin that includes phosphor therein. For this reason, when the light emitting elements 5 sealed by the enclosure 3 emit light, the light emitted from the light emitting element 5 not only directly passes through the enclosure 3 and is emitted outward from the optical semiconductor device 1 but also is absorbed by the phosphor. As a consequence, the phosphor also emits light which is then emitted outward from the optical semiconductor device 1.

After the light emitting elements 5 and the first conductive members 6a are sealed by the enclosure 3, the enclosure 3 is subjected to grinding so that the surface of each first conductive member 6a to come into contact with each external electrode 2a aligns with the surface of the enclosure 3. FIG. 9 shows the state in which the grinding process is finished and the surface of each first conductive members 6a to come into contact with each external electrodes 2a aligns with the surface of the enclosure 3. Thereafter, the support body S is detached to proceed to a step of connecting the second conductive members 6b to the second electrodes 5b1 of the light emitting elements 5.

Note that the step of connecting the second conductive members 6b to the second electrodes 5b1 of the light emitting elements 5 is performed in the same way as the step of connecting the first conductive members 6a to the first electrodes 5a1 which is described with reference to FIGS. 6 to 9. Accordingly, description of this step will be omitted herein.

Figure 10:
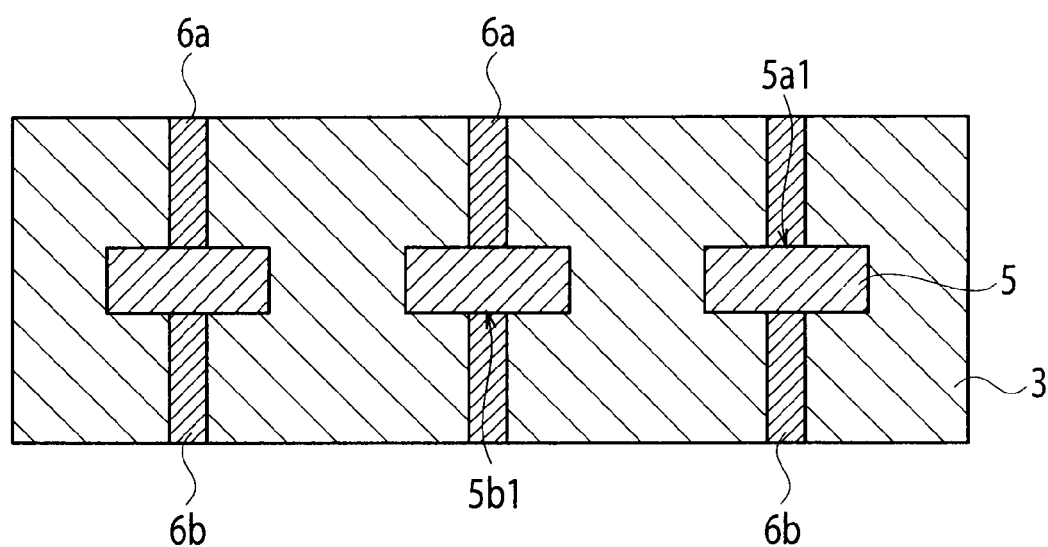
FIG. 10 is an eighth process drawing for explaining the method of manufacturing the semiconductor device according to the first embodiment of the present invention.

FIG. 10 shows a state in which the first conductive members 6a and the second conductive members 6b are respectively connected to the first electrodes 5a1 and the second electrodes 5b1 of the light emitting devices 5 and these constituents are sealed by the enclosure 3.

Figure 11:
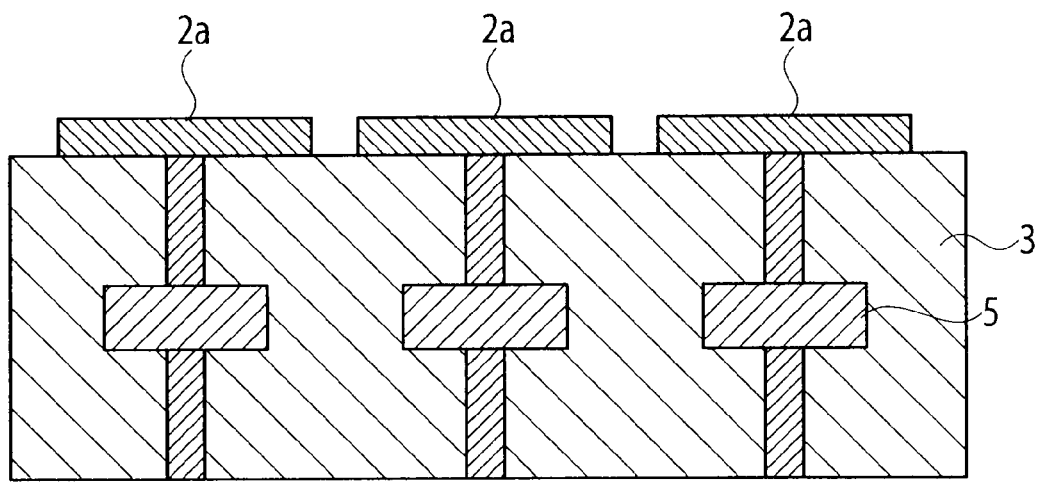
FIG. 11 is a ninth process drawing for explaining the method of manufacturing the semiconductor device according to the first embodiment of the present invention.

Here, the external electrodes 2a are connected to the first conductive members 6a which are ground so as to be aligned with the enclosure 3. FIG. 11 is a view showing this state. The external electrodes 2a are formed by an electroless plating method by using the mask M as shown in FIG. 6, for example. Copper (Cu) is favorably used for the external electrodes 2a, for example.

Here, the surfaces of the external electrodes 2 to be connected to the conductive members 6 also function as reflectors for reflecting light emitted from the light emitting elements 5. Meanwhile, the external electrodes 2 are made of metal and therefore have excellent durability without being deteriorated by light emitted from the light emitting elements 5.

Figure 12:
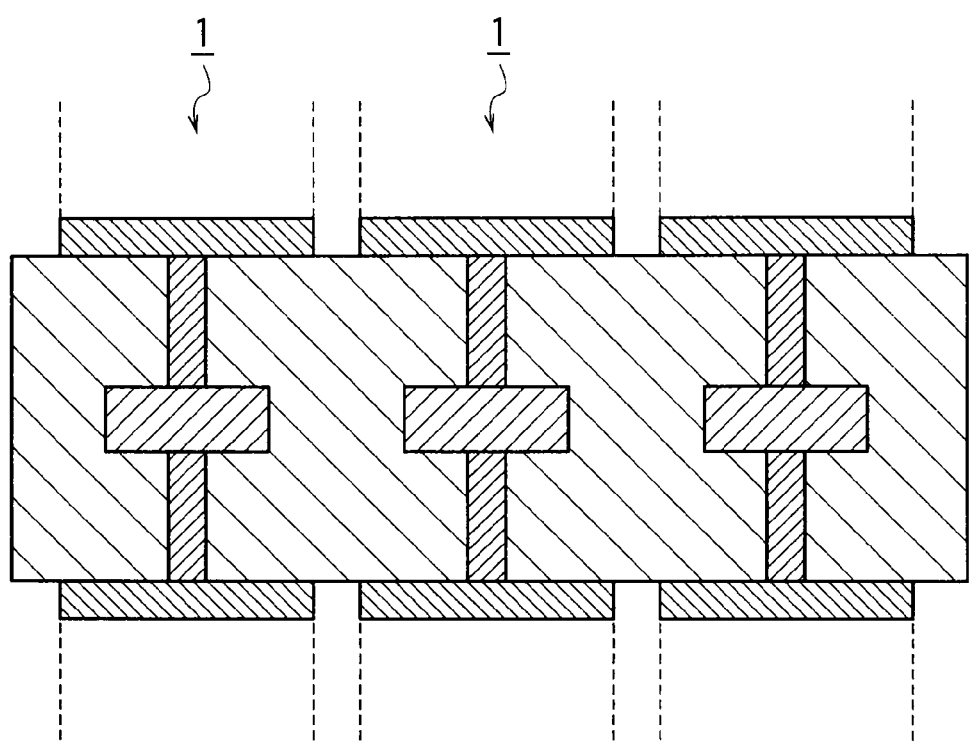
FIG. 12 is a tenth process drawing for explaining the method of manufacturing the semiconductor device according to the first embodiment of the present invention.

After the external electrodes 2b are also connected to the second conductive members 6b, the resultant body is diced, between each adjacent two of the light emitting elements 5, 5 with a blade which is thinner than an interval of each adjacent two of the light emitting elements 5, 5 as shown with broken lines of FIG. 12. In this way, the individual optical semiconductor devices 1 are formed as shown in FIG. 1.

Thereafter, if, for example, the optical semiconductor device 1 is subjected to barrel plating or immersed into a plating tank, it is possible to form the plating films 4 on five surfaces of each of the first external electrode 2a and the second external electrode 2b. For forming the plating film, for example, Nickel-tin (Ni—Sn) plating or nickel-gold (Ni—Au) plating is favorably used. This plating process may be the formation of a single layer on the surfaces of the first external electrode 2a and the second external electrode 2b or the lamination of multiple layers thereon by means of silver plating, solder plating, and the like. Use of the solder plating on the outermost layer in particular makes it possible to improve wettability with solder to be used for connecting the optical semiconductor device 1 to a substrate.

As described above, an employment of the configuration to seal the surrounding of the light emitting element 5 with the enclosure 3 and to electrically connect the electrode surfaces provided on the light emitting element 5 to the pair of external electrodes 2 via the conductive members 6 makes it possible to reduce the number of components and the number of manufacturing steps. Hence it is possible to provide the optical semiconductor device and the method of manufacturing the optical semiconductor device, which are capable of reducing the manufacturing costs and improving productivity.

Moreover, the surface (a first connection surface 2a1) of the first external electrode 2a to be connected to the first conductive member 6a or the surface (a second connection surface 2b1) of the second external electrode 2b to be connected to the second conductive member 6b is formed in parallel with the first surface 5a or the second surface 5b of the light emitting element 5 as shown in FIG. 2. Therefore, light is directed to all directions through the enclosure 3 sealing the surrounding thereof. As a consequence, directivity of the light emitting element 5 is weakened so that the light emitted from the light emitting element 5 is not limited to be directed to any particular direction.

Further, as being used to seal the light emitting element 5, the enclosure 3 which has flexibility makes it possible to prevent the light emitting element 5 from being damaged at the time of manufacturing the optical semiconductor device 1.

Here, it is needless to say that an employment of five-surface electrodes in the semiconductor device according to the embodiment of the present invention has following advantageous effects in addition to the above-mentioned effects at the time of mounting the semiconductor device on the substrate. Specifically, a state of solder bonding can be visually checked at the time of the mounting, and the soldering between the external electrode and the substrate can form a sufficient fillet that reduces damages attributable to external forces such as impacts, for example.

Second Embodiment

Next, a second embodiment of the present invention will be described. In the second embodiment, the same constituents as the constituents described above in the first embodiment will be designated by the same reference numerals and duplicate explanation of the same constituents will be omitted herein.

An optical semiconductor device 11 of the second embodiment is different from the optical semiconductor device 1 of the first embodiment in a shape of the external electrodes. As described previously, in the optical semiconductor device 1 according to the first embodiment, the surfaces (the first connection surface 2a1 and the second connection surface 2b1) of each of the paired external electrodes 2 to be connected to the corresponding conductive member 6 are respectively formed in parallel to the surfaces of the light emitting element 5. On the other hand, in the optical semiconductor device 11 according to the second embodiment, surfaces (a first connection surface 12a1 and a second connection surface 12b1) of paired external electrodes 12 to be connected to corresponding conductive members 16 are respectively formed obliquely to the surfaces of the light emitting element 5.

Figure 13:
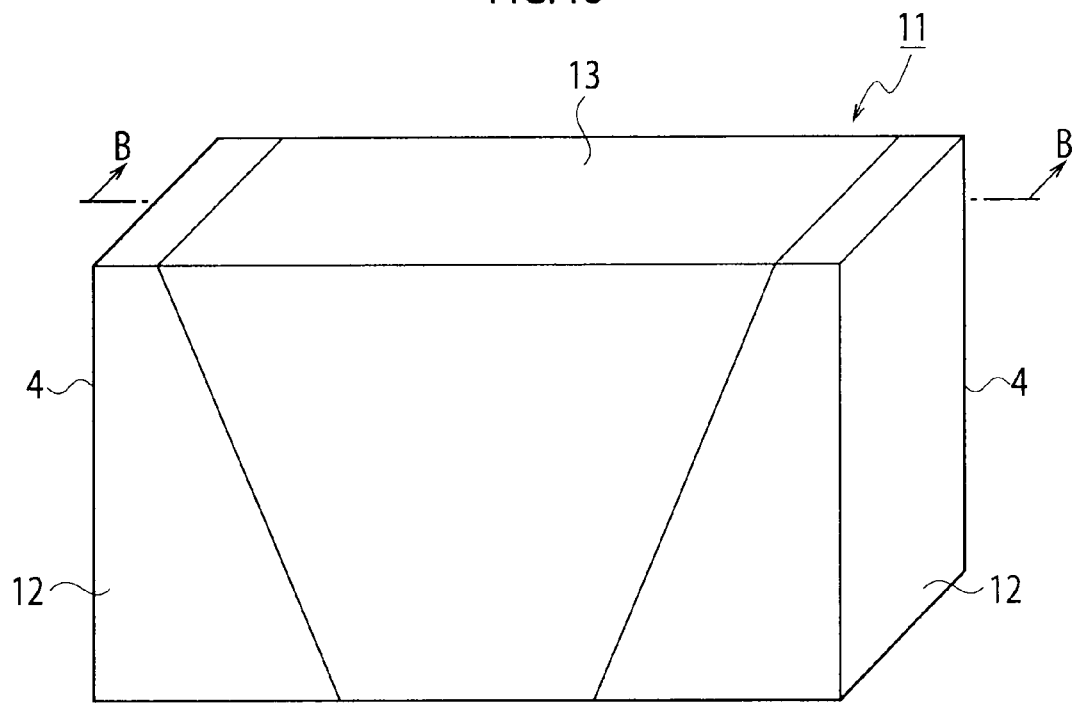
FIG. 13 is a perspective view showing an entire optical semiconductor device according to a second embodiment of the present invention.
Figure 14:
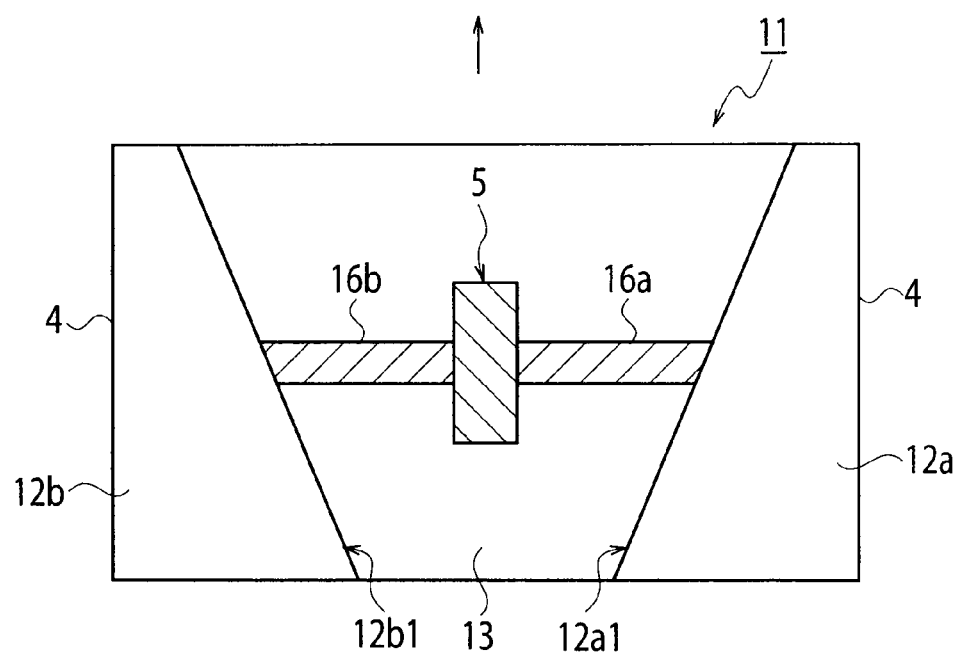
FIG. 14 is a cross-sectional view of the optical semiconductor device shown in FIG. 13 which is taken along the line B-B.

FIG. 13 is a perspective view showing the entire optical semiconductor device 11 according to the second embodiment of the present invention. FIG. 14 is a cross-sectional view showing a cross section of the optical semiconductor device 11 shown in FIG. 13 which is taken along the line B-B.

As simply illustrated in FIG. 13 or in the cross-sectional view of FIG. 14, a surface (the first connection surface 12a1) of a first external electrode 12a connected to a first conductive member 16a is formed obliquely and obliquely faces the first surface 5a of the light emitting element 5. In addition, a surface (the second connection surface 12b1) of a second external electrode 12b connected to a second conductive member 16b is also formed obliquely and obliquely faces the second surface 5b of the light emitting element 5.

Meanwhile, surfaces of the conductive members 16 to be respectively connected to the external electrodes 12 are formed so as to fit to the shapes (inclinations) of the first connection surface 12a1 and the second connection surface 12b1 of the external electrodes 12. Moreover, the shape of an enclosure 13 for sealing the light emitting element 5 and the conductive members 16 is also formed into a substantially trapezoidal shape so as to fit to the shapes (inclinations) of the first connection surface 12a1 and the second connection surface 12b1 of the external electrodes 12 when illustrating the optical semiconductor device 11 from a direction as shown in FIG. 14, for example.

As the first external electrode 12a and the second external electrode 12b are formed into the above-described shapes, the light emitted from the light emitting element 5 is reflected by the first connection surface 12a1 and the second connection surface 12b1 and is directed to a direction of an arrow shown in FIG. 14. Here, it is needless to say that the shapes (inclinations) of the first connection surface 12a1 and the second connection surface 12b1 can be designed as appropriate. Moreover, the first connection surface 12a1 and the second connection surface 12b1 may be formed so as to face each other symmetrically with respect to the light emitting element 5. Alternatively, the shapes (inclinations) of these surfaces may be formed differently from each other.

The optical semiconductor device 11 is manufactured in accordance with the following steps. Here, the steps in the method of manufacturing the optical semiconductor device 1 which have been described with reference to FIGS. 3 to 10 in the first embodiment are also applied to the method of manufacturing the optical semiconductor device 11. Accordingly, the duplication explanation will be omitted in the following description.

Figure 15:
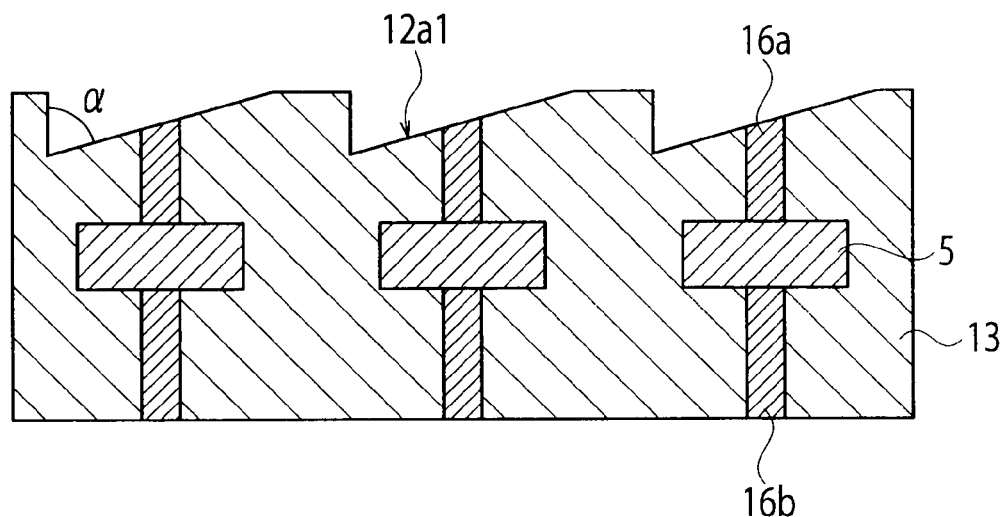
FIG. 15 is a first process drawing for explaining a method of manufacturing the semiconductor device according to the second embodiment of the present invention.

As shown in FIG. 10, the light emitting element 5, the first conductive member 16a, and the second conductive member 16b are sealed by the enclosure 13. Thereafter, as shown in FIG. 15, regions of the first conductive members 16a and the enclosure 13 to be connected to the first external electrodes 12a are ground. This grinding process may be done by using a laser or a grinder, for example. Surfaces (regions) that appear after the grinding process constitute the connection surfaces (the first connection surfaces 12a1) between the first conductive members 16a and the first external electrodes 12a when the first external electrodes 12a are formed. Moreover, an angle α shown in FIG. 15 serves as an angle of the reflectors when the external electrodes 12a are formed.

Figure 16:
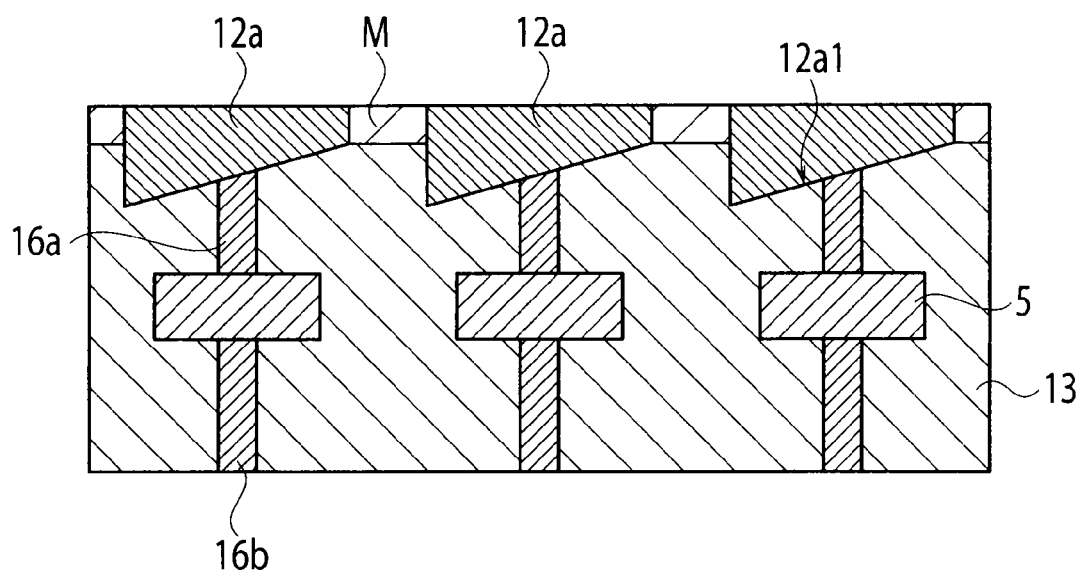
FIG. 16 is a second process drawing for explaining the method of manufacturing the semiconductor device according to the second embodiment of the present invention.

After the grinding process, the mask M is disposed in a predetermined position to form the first external electrodes 12a. The first external electrodes 12a are formed in accordance with the electroless plating method, for example, as similar to the method of forming the external electrodes 2 of the optical semiconductor devices 1 in the above-described first embodiment. Copper (Cu) is favorably used for the first external electrodes 12a, for example. FIG. 16 shows a state after the first external electrodes 12a are formed.

Figure 17:
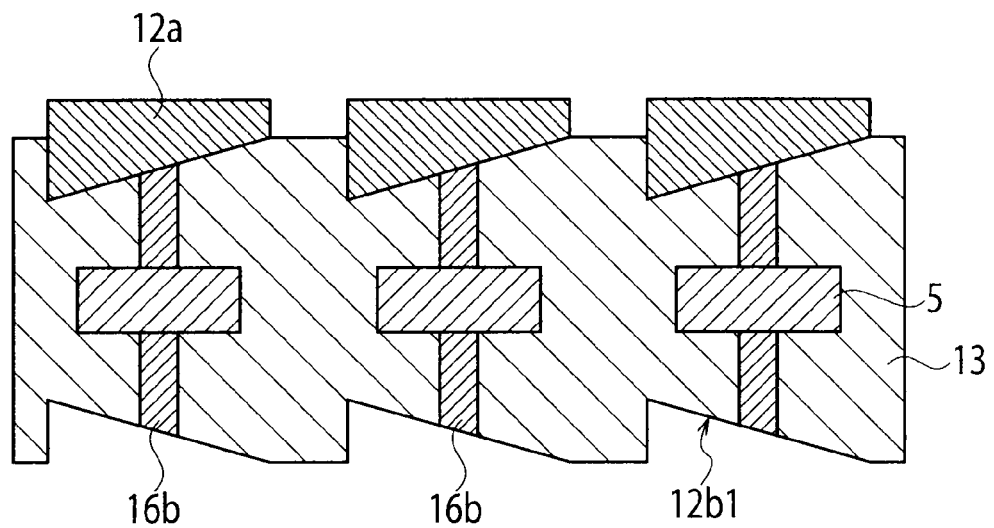
FIG. 17 is a third process drawing for explaining the method of manufacturing the semiconductor device according to the second embodiment of the present invention.

Thereafter, as shown in FIG. 17, the mask M used for forming the first electrodes 12a is removed and then the second external electrodes 12b to be connected to the second conductive members 16b are formed. The method of forming the second external electrodes 12b is the same as the method of forming the first external electrodes 12a.

Figure 18:
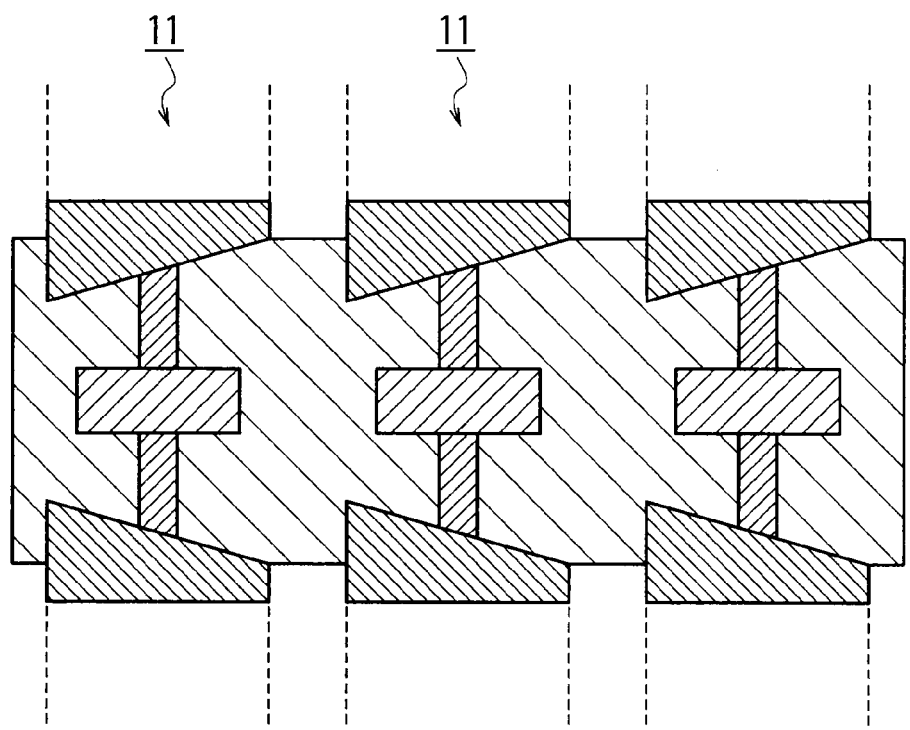
FIG. 18 is a fourth process drawing for explaining the method of manufacturing the semiconductor device according to the second embodiment of the present invention.
Figure 19:
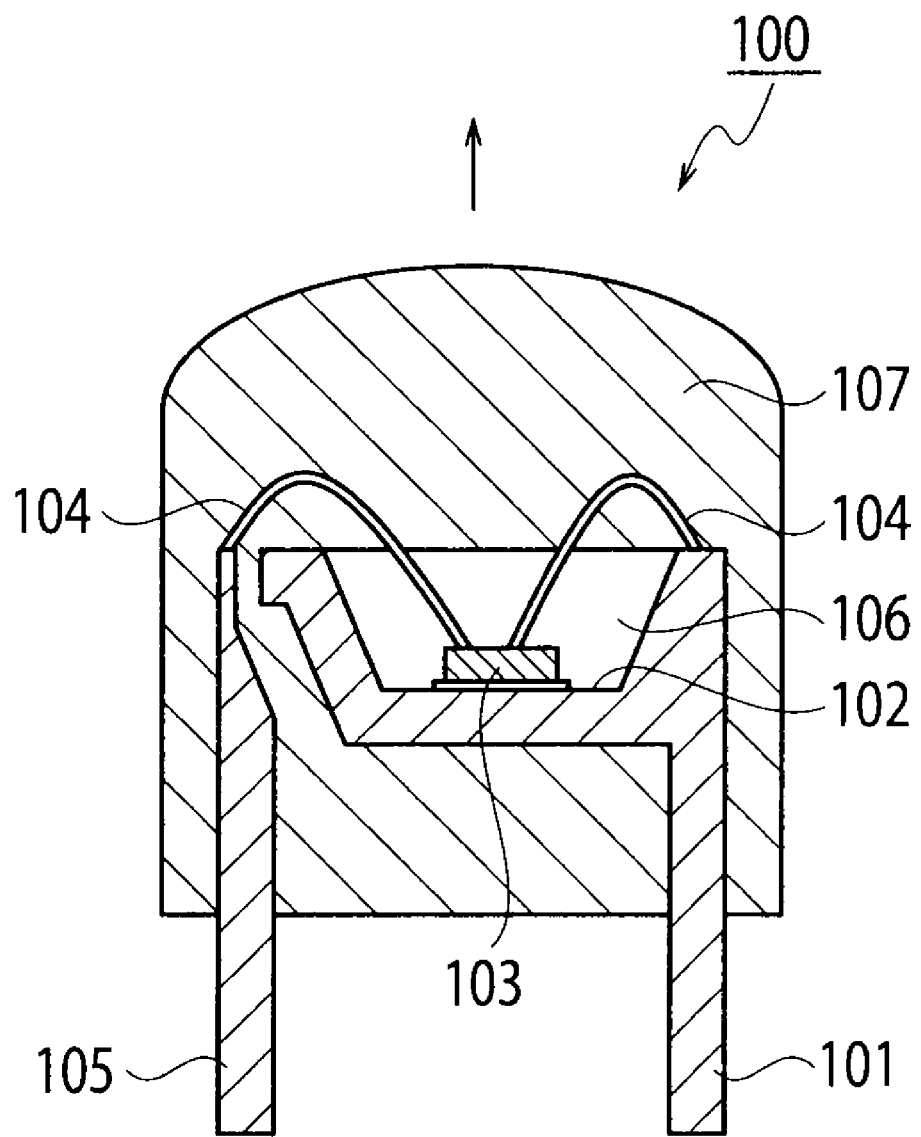
FIG. 19 is a cross-sectional view for explaining a conventional optical semiconductor device.

After the external electrodes 12b are connected to the second conductive members 16b, the resultant body is diced, between each adjacent two of the light emitting elements 5, 5, with the blade which is thinner than an interval of each adjacent two of the light emitting elements 5, 5 as shown with broken lines of FIG. 18. In this way, the individual optical semiconductor devices 11 are formed as shown in FIG. 13.

Thereafter, if, for example, the optical semiconductor device 11 is subjected to barrel plating or immersed into a plating tank, the plating films 4 are formed on five surfaces of each of the first external electrode 12a and the second external electrode 12b.

As described above, an employment of the configuration to seal the surrounding of the light emitting element 5 with the enclosure 13 and to electrically connect the electrode surfaces provided on the light emitting element 5 to the pair of external electrodes 12 via the conductive members 16 makes it possible to reduce the number of components and the number of manufacturing steps. Hence it is possible to provide the optical semiconductor device and the method of manufacturing the optical semiconductor device, which are capable of reducing the manufacturing costs and improving productivity.

In particular, by forming each of the external electrodes 12 into the above-described shape, it is possible to direct the light emitted from the light emitting element 5 to a predetermined direction and thereby to supply the optical semiconductor device having finer directivity.

Further, as being used to seal the light emitting element 5, the enclosure 13 which has flexibility makes it possible to prevent the light emitting element 5 from being damaged at the time of manufacturing the optical semiconductor device 1.

Here, it is needless to say that an employment of five-surface electrodes in the semiconductor device according to the embodiment of the present invention has following advantageous effects in addition to the above-mentioned effects at the time of mounting the semiconductor device on the substrate. Specifically, a state of solder bonding can be visually checked at the time of the mounting, and the soldering between the external electrode and the substrate can form a sufficient fillet that reduces damages attributable to external forces such as impacts, for example.

It is to be understood that the present invention is not limited only to the above-described embodiments and that the present invention may be realized in a practical phase by modifying the constituents without departing from the scope of the invention. Moreover, various other embodiments of the invention may be achieved by appropriately combining the constituents disclosed in the above-described embodiments. For example, it is possible to eliminate some constituents out of all the constituents described in any of the embodiments. Alternatively, it is possible to appropriately combine the constituents that appear in different embodiments.

This invention is not limited to the above-described embodiment. The present invention can also be implemented by modifying the constituents without departing from the scope of the invention. Moreover, other aspects of the present invention can be achieved by appropriately combining the constituents that are disclosed in the above-described embodiment. For example, several constituents can be eliminated from all the constituents of the embodiment. Further, it is also possible to combine the constituents that are disclosed in different embodiments as appropriate.

What is claimed is:

1. A method of manufacturing an optical semiconductor device comprising the steps of:
   dividing a light emitting element wafer on a support body into light emitting elements by cutting the light emitting element wafer in a direction toward the support body;
   rearranging the light emitting elements by expanding the support body;
   forming a first conductive member on a first electrode provided on a first surface of each of the light emitting elements;

sealing the light emitting elements and the first conductive members by an enclosure;

detaching the support body and forming a second conductive member on a second electrode provided on a second surface of each of the light emitting elements;

sealing the second electrodes and the second conductive members by the enclosure;

connecting a first external electrode to the first conductive member and connecting a second external electrode to the second conductive member;

performing dicing between each adjacent two of the light emitting elements to divide optical semiconductor devices from each other; and forming plating films respectively on the first external electrode and the second external electrode by plating.

2. A method of manufacturing an optical semiconductor device comprising the steps of:

dividing a light emitting element wafer on a support body into light emitting elements by cutting the light emitting element wafer in a direction toward the support body;

rearranging the light emitting elements by expanding the support body;

forming a first conductive member on a first electrode provided on a first surface of each of the light emitting elements;

sealing the light emitting elements and the first conductive members by an enclosure;

detaching the support body and forming a second conductive member on a second electrode provided on a second surface of each of the light emitting elements;

sealing the second electrodes and the second conductive members by the enclosure;

grinding the first conductive member and the enclosure sealing the first conductive member so that the first conductive member and the enclosure are oblique with respect to the first surface;

forming on the ground surface a first external electrode to be connected to the first conductive member;

grinding the second conductive member and the enclosure sealing the second conductive member so that the second conductive member and the enclosure are oblique with respect to the second surface;

forming on the ground surface a second external electrode to be connected to the second conductive member;

performing dicing between each adjacent two of the light emitting elements to divide optical semiconductor devices from each other; and forming plating films respectively on the first external electrode and the second external electrode by plating.

* * * * *